(12) United States Patent
Forey et al.

(10) Patent No.: US 7,302,365 B2
(45) Date of Patent: Nov. 27, 2007

(54) APPARATUS AND METHOD FOR PERFORMING EYE SCAN

(75) Inventors: Simon Forey, Northampton (GB); Andrew Pickering, Rugby (GB); Robert Simpson, Buckingham (GB); Tom Leslie, Northampton (GB)

(73) Assignee: Texas Instruments Incorporated, Dallas, TX (US)

( * ) Notice: Subject to any disclaimer, the term of this patent is extended or adjusted under 35 U.S.C. 154(b) by 54 days.

(21) Appl. No.: 11/151,132

(22) Filed: Jun. 13, 2005

(65) Prior Publication Data
US 2006/0139033 A1 Jun. 29, 2006

(30) Foreign Application Priority Data
Jun. 12, 2004 (GB) ................... 0413142.1

(51) Int. Cl.
G06F 13/22 (2006.01)
(52) U.S. Cl. .............. 702/189; 702/182; 702/190; 702/194
(58) Field of Classification Search ........... 702/141, 702/142, 182, 183, 186, 189, 190, 194; 324/76.58, 324/58, 76; 359/189; 375/348
See application file for complete search history.

(56) References Cited
U.S. PATENT DOCUMENTS 6,157,688 A * 12/2000 Tamura et al. ............. 375/348
7,092,472 B2 * 8/2006 Stojanovic ................. 375/371
2003/0043440 A1 * 3/2003 Suzaki et al. .............. 359/189
2004/0183518 A1 * 9/2004 Weller et al. ............ 324/76.58
2004/0203559 A1 * 10/2004 Stojanovic et al. ......... 455/403
2005/0180498 A1 * 8/2005 Bhakta et al. .............. 375/233

FOREIGN PATENT DOCUMENTS

GB  2 399 647 A  9/2004
GB  2 404 445 A  2/2005

* cited by examiner

Primary Examiner—Eliseo Ramos-Feliciano
Assistant Examiner—Felix Suarez
(74) Attorney, Agent, or Firm—William B. Kempler; W. James Brady, III; Frederick J. Telecky, Jr.

(57) ABSTRACT

There is provided a method and apparatus for performing an eye scan. Said apparatus comprises: a receiver for receiving input signals; an equaliser for processing said input signals; a data sampler for sampling said processed input signals at certain sampling points to produce a data output, said data sampler being controlled by a clock signal; an edge sampler for detecting the edges of the processed input signal; an early/late voter for deciding whether a current sampling point needs to be advanced or retarded. The early/late voter passes an Up/Down signal to an interpolator for maintaining said clock signal, said interpolator acting on said Up/Down signal to adjust the clock signal by stepping it forward or backward according to control need, so that said sampling point can be advanced or retarded.

6 Claims, 4 Drawing Sheets

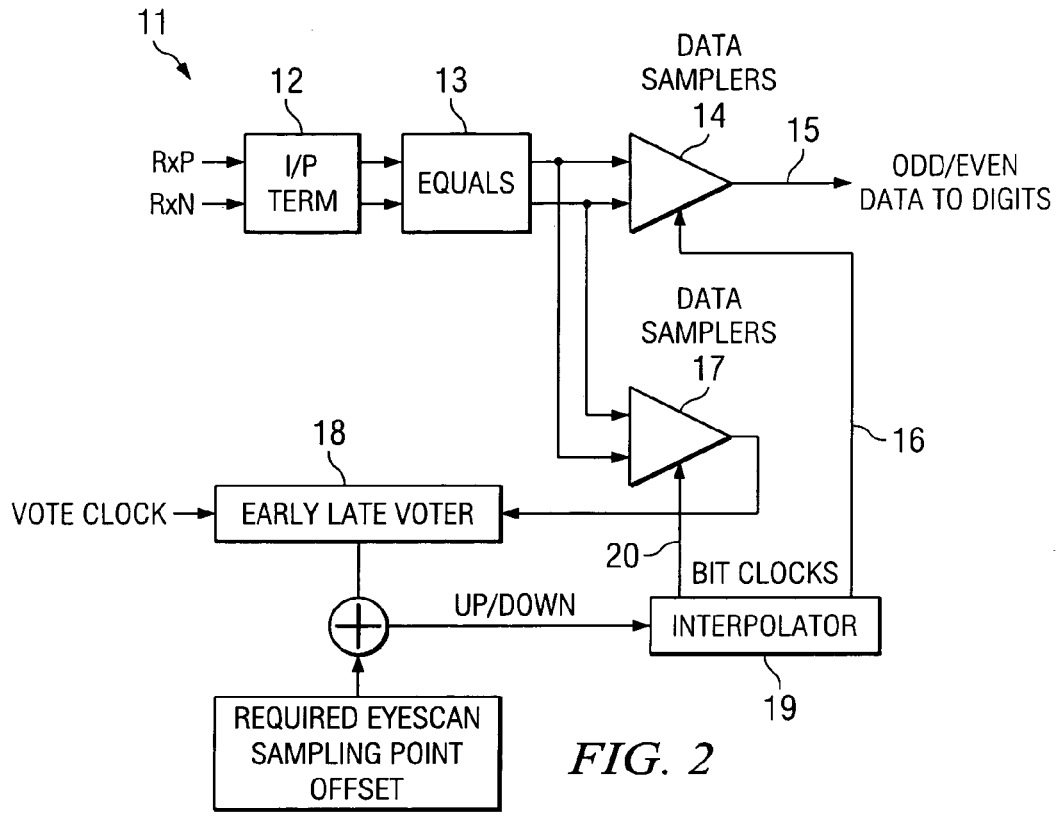
*FIG. 2*
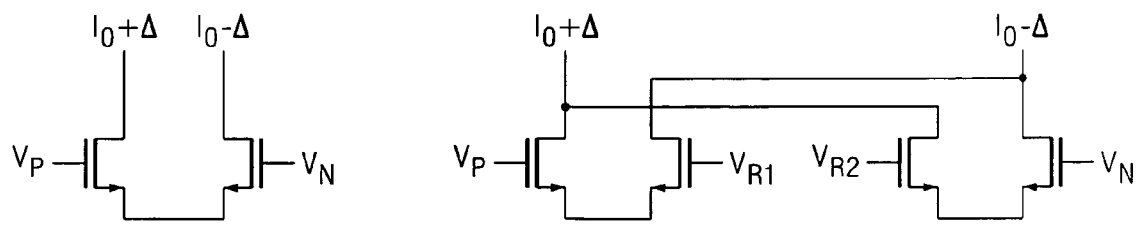
*FIG. 3*   *FIG. 4a*
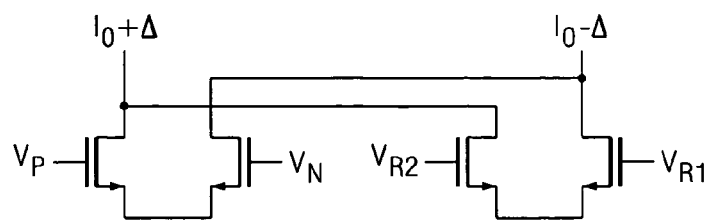
*FIG. 4b*

APPARATUS AND METHOD FOR PERFORMING EYE SCAN

BACKGROUND OF THE INVENTION

The present invention relates to improvements in testing, and more particularly to an apparatus and method for performing an eye scan.

SUMMARY OF THE INVENTION

In FIG. 1 there is shown a datastream made up of differential signals 1 and 2 (RxP and RxN) which, in this case, show a stream of alternate 1's and 0's. The data may be recovered successfully if a clock can be generated to trigger sampling at points S in the datastream, such as for example, a sampling at time of 5 will recover the first 1.

In practice, the datastream received will not be of the idealized form shown in FIG. 1(a), but more likely subject to noise and distortion, as shown in FIG. 1(b).

If the differential signals are superimposed (FIG. 1(c)) it will be appreciated that the separation of the signals gives an indication of the quality of reception. Typically the separation is wider away from the edges and towards the centre and narrower towards the edges and away from the centre. This yields a characteristic shape which has become known in the art as an eye.

In order to determine the sampling instant S, an attempt is made to identify the transitions or edges of the signals 3 and 4. It may then be deduced that samples should be taken substantially midway between the detected edges. Since the edges are subject to noise and jitter they must be tracked and the actual instantaneous sampling point moved accordingly.

DESCRIPTION OF THE DRAWINGS

FIG. 2 is a schematic diagram showing an arrangement for performing an eye scan in accordance with a preferred embodiment of the present invention;

FIG. 3 is a schematic diagram of sense amplifier;

FIGS. 4a and 4b are schematic diagrams of a circuit by which a differential signal can be switched against a differential reference;

DETAIL DESCRIPTION

Figure 1A:
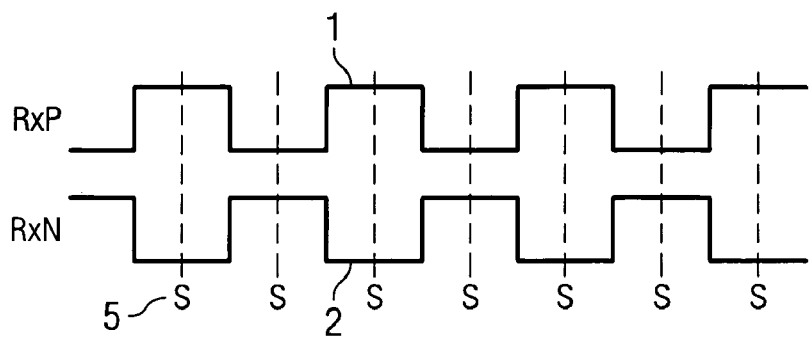
FIG. 1a is a diagram showing the idealised form for a datastream input to a receiver.
Figure 1B:
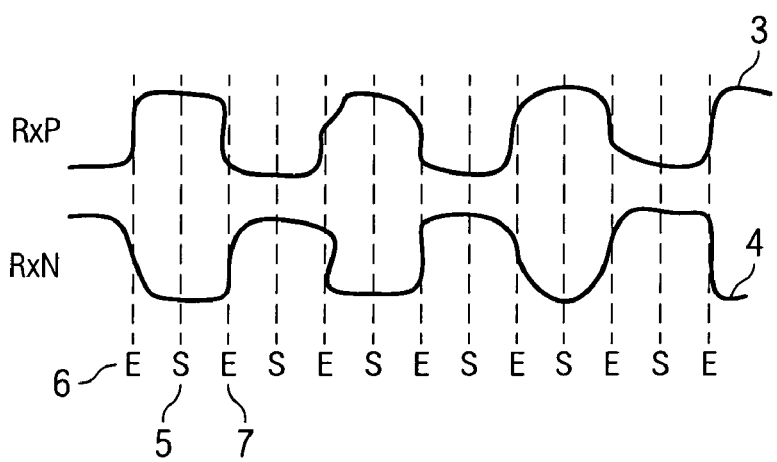
FIG. 1b is a diagram showing an example of the actual form of the datastream input to a receiver, suffering form the effect of noise and distortion.
Figure 1C:
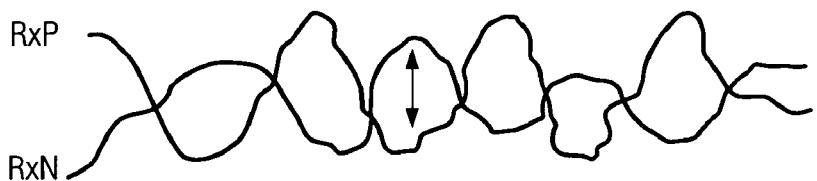
FIG. 1c is a diagram showing differential signals of the datastream superimposed over each other, giving rise to the characteristic "eye" shape.
Figure 1D:
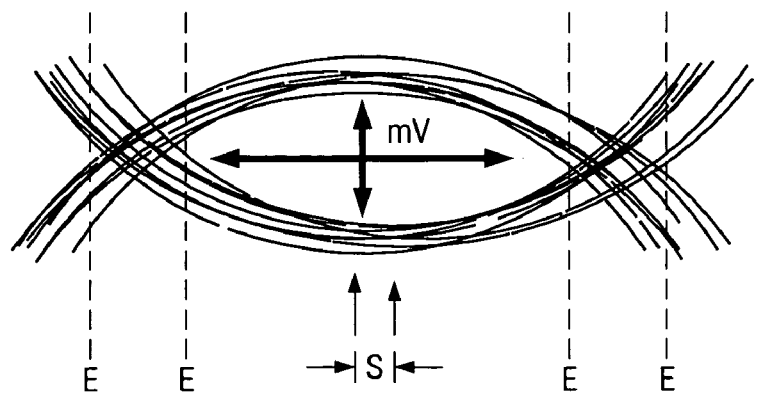
FIG. 1d shows the characteristic "eye" share generated by the signal of FIG. 1c.

The present invention provides a simple techniques for determining how badly degraded a signal is before it gets to a chip. An arrangement for achieving this is shown in FIG. 2. Input signals 11 are received at receiver 12 and processed by an equaliser 13. The data is sampled by data sampler 14 to produce the data output 15. The data sampler is controlled by a clock signal 16 such that if clock signal 16 transitions at the desired sampling instant S, the data will be correctly recovered. Hence signal 16 constitutes a clock recovered at the receiver.

Recovered clock signal 16 is maintained by a stepped phase interpolator 19, which may be controlled to alter the precise sampling instant, such that the changes in the incoming signal may be tracked. Since the data rate of the incoming signal may be very high (equivalent to for example to a clock data rate of 2 GHz or more) it is not practical to control the position of each and every sampling point. Accordingly, the interpolator is used to maintain a clock signal and is adjusted from time to time, for example at one quarter of the recovered clock rate. This is achieved by detecting the edges of the received signal in edge sampler 17 and then using early/late voting 18 to decide whether the current sampling point needs to be advanced or retarded. Accordingly an Up/Down signal is fed to step the phase interpolator. The interpolator is then stepped forward or backward according to the control need.

The early late voter is disabled during eye scan, otherwise it would try and put the sampling point back to where it should be rather than allow the sampling point to be offset.

If an absolute value can be attached to the sample then a measure of the height of the eye is given. If the sampling point came be moved within the window defined by the normal edges of the signal and multiple measurements made then the profile of the eye within the window can be established. Moving the sampling point over the window and making multiple measurements is referred to as an eye scan.

Clearly, it is not normally possible to obtain an absolute value for the height of the eye with normal detection circuitry, which is configured simply to detect and a 1 or a 0. Equally, it would be impractical and costly to include measurement circuitry in standard devices, merely to perform an eye scan.

The present invention provides an apparatus for performing an eye scan without such overhead.

Considering firstly the measurement of height of the eye, if the threshold value of a comparator capable of detecting a 1 or a 0 can be changed and a gradually increasing offset added, at some point a 1 will be erroneously taken as a 0, and vice versa.

If a known pseudo-random binary number sequence is transmitted, then the values detected at the comparator with offset may be compared with the target sequence. As the offset is increased, the onset of detection errors indicates that the boundary of the eye has been located.

A typical sense amplifier might be based on a transconductance stage like that shown in FIG. 3.

The differential output current $2\Delta I$ is equal to $g_m(V_p-V_N)$. This differential output current is used to drive a clocked latch which then produces the output voltage signal.

In order to perform eye scan it is necessary to switch the differential signal against a differential reference. There are two methods by which this can be achieved, illustrated in FIG. 4a and FIG. 4b.

The choice between these two options is essentially governed by issues like voltage headroom and common-mode settings.

In normal (ie non-eyescan) operation, $$V_{R1} = V_{R2} = \frac{V_P + V_N}{2},$$

which is the input common-mode voltage. The differential output current $2\Delta I$ for the circuit in FIG. 4a is the sum of $$g_m\left(V_P - \left[\frac{V_P + V_N}{2}\right]\right) = g_m \frac{V_P - V_N}{2}$$

and $$g_m\left(\left[\frac{V_P + V_N}{2}\right] - V_N\right) = g_m \frac{V_P - V_N}{2}$$

resulting in $g_m(V_P-V_N)$.

Likewise for the circuit shown in FIG. 4b, the differential output current is the sum of $$g_m(V_P-V_N)$$

and $$g_m(V_{R1}-V_{R2})=0$$

again resulting in $g_m(V_P-V_N)$

During eyescan operation, a DAC is used to apply an offset signal $V_{OS}$ to the input common mode signal so that the references $V_{R1}$ and $V_{R2}$ become $$V_{R1} = \frac{V_P + V_N}{2} + V_{OS}$$

and $$V_{R2} = \frac{V_P + V_N}{2} - V_{OS}$$

The differential output current in eyescan mode, for the circuit in FIG. 4a is therefore $$g_m(V_P - V_{R1}) + g_m(V_{R2} - V_N) = g_m\left(V_P - \left[\frac{V_P + V_N}{2} + V_{OS}\right]\right) +$$

$$g_m\left(\left[\frac{V_P + V_N}{2} - V_{OS}\right] - V_N\right)$$

$$= g_m\left(\frac{V_P - V_N}{2} - V_{OS}\right) +$$

$$g_m\left(\frac{V_P - V_N}{2} - V_{OS}\right)$$

$$= g_m(V_P - V_N - 2V_{OS})$$

In a similar way, the differential output current in eyescan mode for the circuit in FIG. 4b is given by $$g_m(V_P - V_N) + g_m(V_{R2} - V_{R1}) = g_m(V_P - V_N) + g_m$$

$$\left(\left[\frac{V_P + V_N}{2} - V_{OS}\right] - \right.$$

$$\left.\left[\frac{V_P + V_N}{2} + V_{OS}\right]\right)$$

$$= g_m(V_P - V_N) + g_m(-2V_{OS})$$

$$= g_m(V_P - V_N - 2V_{OS})$$

illustrating that the operation of both circuits FIG. 4a and FIG. 4b is essentially the same in eyescan mode.

Since the input bits are random data, $V_P>V_N$, approximately half of the time, ie when the input data is a "one" so that $g_m(V_P-V_N)$ will be a positive quantity. However as $V_{OS}$ is increased, eventually $g_m(V_P-V_N-2V_{OS})$ will become negative, and the reported value of the received bit will be a "zero" rather than a "one". Since the input data is a known PRBS sequence, this discrepancy can be detected, and the value of $(V_P-V_N)$, which is the desired quantity, will then be equal to $2V_{OS}$, and is therefore known.

Figure 5A:
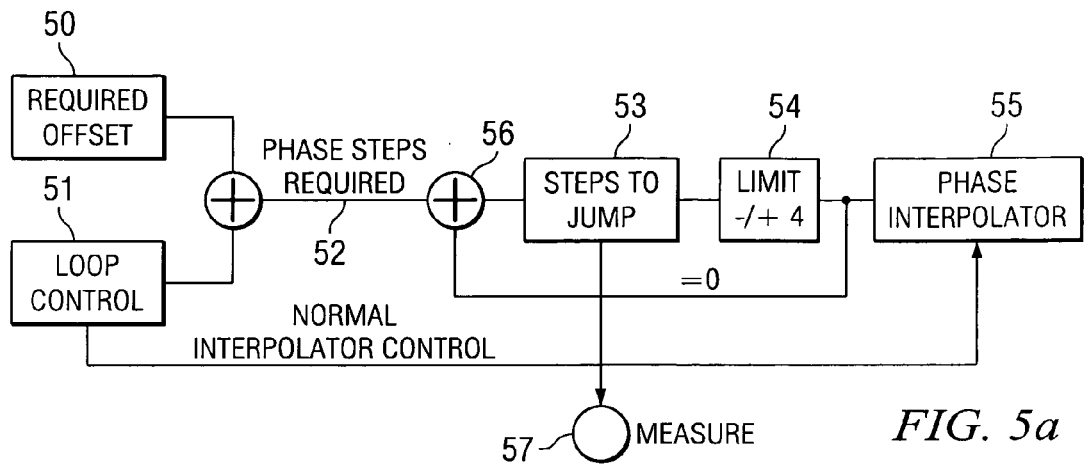
FIG. 5a is a diagram showing how the offset is added to the phase interpolator in accordance with an embodiment of the present invention.

Modifications which may be made to the arrangement to allow the sampling point to be shifted in time will now be described. In FIG. 5a the usual control signal that would be applied to stepping interpolator 55, is represented by block 51.

Figure 5B:
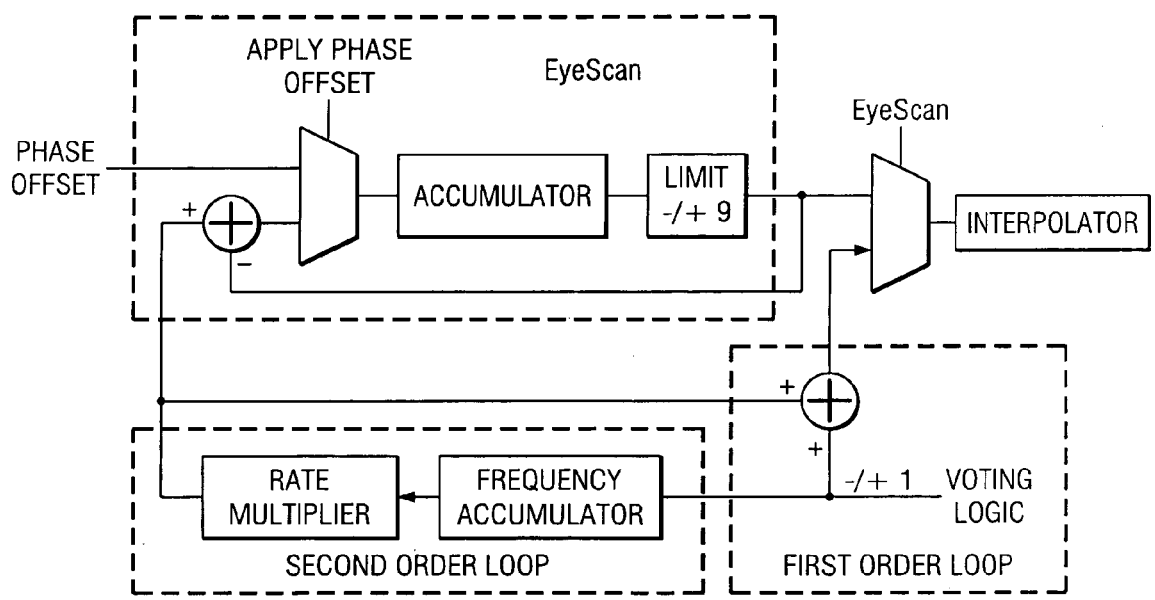
FIG. 5b is a diagram showing how first and second order loop control can be added to the eye scan.

The phase offset necessary to position the sampling point at the position required to perform a measurement is introduced at 50. This represents the number of the phase steps required to move the sampling point from its present position to the required position 52. This represents the initial value of phase steps to be moved 53. However, as previously described, the interpolator 55 may only be stepped and in the example, the stepping limit is plus or minus 4. If the value in 53 indicates that stepping is required, the value is limited to plus or minus four steps. If the actual value required is greater than four, then the four steps made are subtracted at 56 from the steps to jump value, so that the interpolator steps its way towards the required position. When the steps to jump value 53 is zero, a measurement signal 57 is generated, indicating that the correct sampling point has been reached and that an eye boundary measurement may be made. FIG. 5b shows how the first and second order loop control can be added to the eye scan.

Figure 6A:
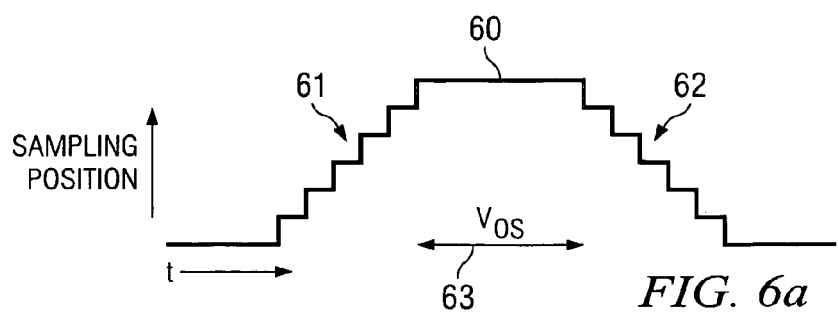
FIGS. 6a and 6b are schematic diagrams showing the stepping of sampling points in accordance with an embodiment of the present invention.

The stepping of the sampling point is illustrated in FIG. 6(a) where it will be seen that the phase is stepped during time 61 up to the required value 60. During this time the offset Vos may be applied to the comparator or as herein before described. When the measurement is completed, the sample position is stepped back during time 62 to normal control.

Figure 7:
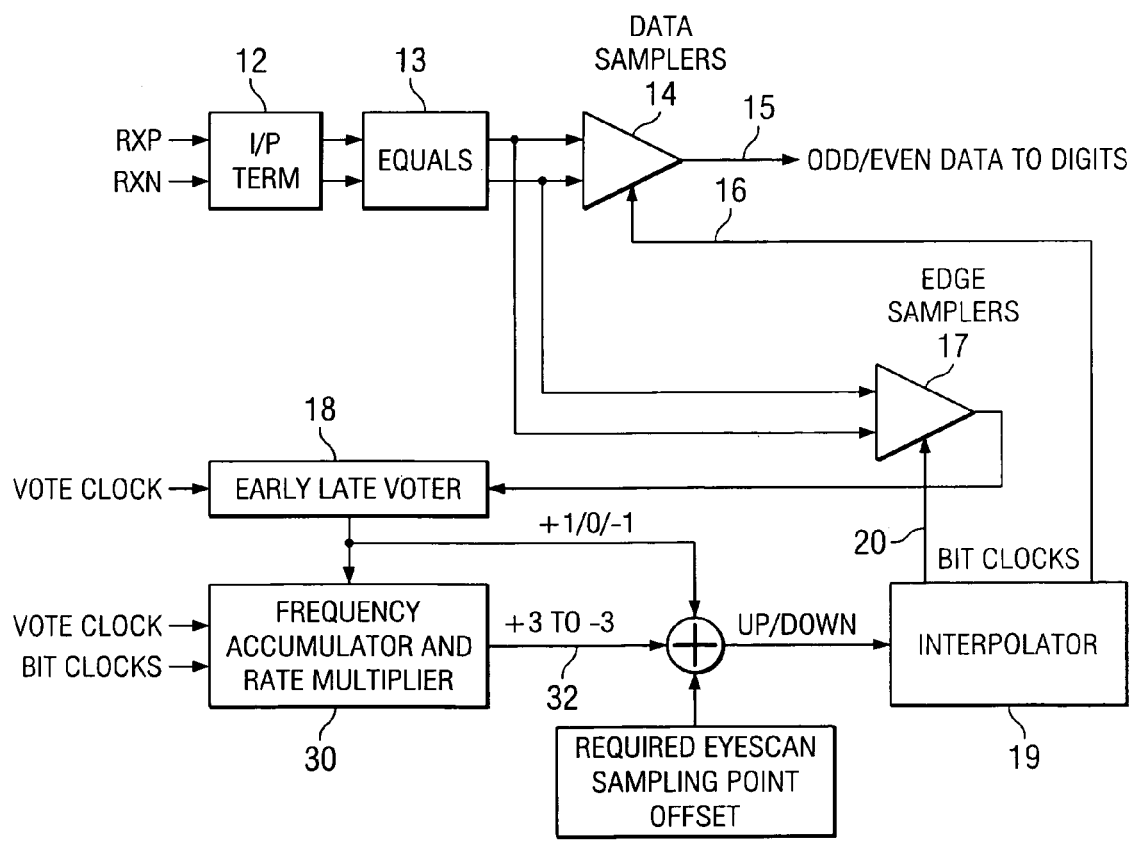
FIG. 7 is a schematic diagram showing a modified arrangement for performing eye scan where both frequency and phase control is provided in accordance with another embodiment of the present invention.

In a modified arrangement, both frequency and phase control is provided. Such an arrangement is shown in FIG. 7, in which the addition of a frequency accumulator and rate multiplier 30 is shown to generate further signals 32, which are summed with those of the phase response of the early/late voter to provide an improved control signal to the phase interpolator.

The purpose of the accumulator 30 is to be responsive to frequency changes in the input signal and may for example be configured to detect trends in the results of the early/late voter, rather than simply react to the error signal. In this way the range of frequencies for which this system is able to recover the clock may be greatly enhanced.

Figure 6B:
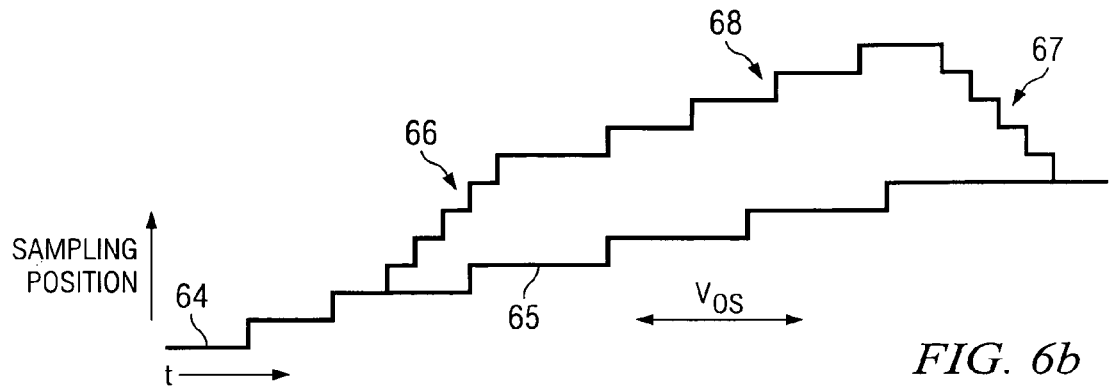

The behaviour of this system is illustrated in FIG. 6(b), where phase 64 is being stepped to accommodate a frequency offset. This is illustrated at 65. During time 66, the interpolator is stepped up to provide the required measurement position during 68 and the Vos may be applied to the comparator. At time, 67 the interpolator is stepped back, not to its initial value, but rather to the value determined by tracking the frequency offset.

It will be appreciated that a full scan requires multiple measurements to be made. Typically, the apparatus will be allowed to settle back to normal control in between measurements. In this way a system is provided in which data is not lost, except during special measurement phases deliberately introduced into the datastream.

The measurement the accuracy of the measurement of the eye boundary may be statistically increased by performing multiple measurements at the same point.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. Apparatus for performing an eye scan, comprising:
   a receiver for receiving input signals;
   an equalizer for processing said input signals;
   a data sampler for sampling said processed input signals at certain sampling points to produce a data output, said data sampler being controlled by a clock signal;
   an edge sampler for detecting the edges of the processed input signal;
   an early/late voter for deciding whether a current sampling point needs to be advanced or retarded wherein said early/late voter passes an Up/Down signal to an interpolator for maintaining said clock signal, said interpolator acting on said Up/Down signal to adjust the clock signal by stepping it forward or backward according to control need, so that said sampling point can be advanced or retarded; and
   an accumulator for adding an eye scan sampling point offset to the Up/Down signal prior to its reception at the interpolator wherein the offset changes a known input signal from one binary state to another, wherein a boundary condition for the eye scan is determined.

2. Apparatus of claim 1 further comprising a transconductance stage sense amplifier coupled to the accumulator to detect the offset changes.

3. Apparatus of claim 2 wherein differential output current of the sense amplifier is equal to gm $(V_{p-VN} - 2V_{OS})$ wherein
   gm=transconductance of sense amplifier
   $V_P$=positive pulse voltage level
   $V_N$=negative pulse voltage level
   $V_{OS}$=offset voltage.

4. A method for performing eye scan boundary measurement comprising the steps of:
   receiving an input signal;
   processing said input signal;
   sampling said processed input signal at sampling points to produce a data output, said sampling being controlled by a clock signal generated by an interpolator;
   detecting the edges of the processed input signal;
   deciding whether a current sampling point needs to be advanced or retarded;
   applying an Up/Down signal to the interpolator to adjust the clock signal by stepping it forward or backward according to control need, so that said sampling point can be advanced or retarded; adding an eye scan sampling point offset to the Up/Down signal, prior to the Up/Down signal being received at the interpolator wherein the offset changes a known input signal from one binary state to another, wherein a boundary condition for the eye scan is determined.

5. Method of claim 4 further comprising utilizing a transconductance stage as a sense amplifier for detecting the offset changes.

6. Method of claim 5 wherein generating a differential output current from the sense amplifier equal to gm $(V_{P-VN} - 2V_{OS})$ wherein
   gm=transconductance of sense amplifier
   $V_p$=positive pulse voltage level
   $V_N$=negative pulse voltage level
   $V_{OS}$=offset voltage.

* * * * *